(12) United States Patent
Wang

(10) Patent No.: US 11,984,158 B2
(45) Date of Patent: May 14, 2024

(54) NON-VOLATILE STATIC RANDOM ACCESS MEMORY INCORPORATING RESISTIVE RANDOM-ACCESS MEMORY

(71) Applicant: Powerchip Semiconductor Manufacturing Corporation, Hsinchu (TW)

(72) Inventor: Zih-Song Wang, Nantou County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 190 days.

(21) Appl. No.: 17/747,998

(22) Filed: May 18, 2022

(65) Prior Publication Data

US 2023/0253037 A1 Aug. 10, 2023

(30) Foreign Application Priority Data

Feb. 10, 2022 (TW) .................................. 111104909

(51) Int. Cl.
*G11C 13/00* (2006.01)
*G11C 5/06* (2006.01)
*H03K 19/017* (2006.01)

(52) U.S. Cl.
CPC .......... *G11C 13/0028* (2013.01); *G11C 5/063* (2013.01); *G11C 13/0026* (2013.01); *G11C 13/0038* (2013.01); *H03K 19/01742* (2013.01)

(58) Field of Classification Search
CPC . G11C 13/0028; G11C 5/063; G11C 13/0026; G11C 13/0038; G11C 2013/0083; G11C 13/0007; G11C 13/004; G11C 13/0069; G11C 14/009; G11C 29/80; G11C 11/413; H03K 19/01742; H10B 10/12
See application file for complete search history.

(56) References Cited

U.S. PATENT DOCUMENTS

| | | | |
|---|---|---|---|
| 6,847,543 B2 | 1/2005 | Toyoda | |
| 7,760,538 B1* | 7/2010 | Paak | G11C 14/0081 365/189.11 |
| 8,331,134 B2 | 12/2012 | Chiu | |
| 2004/0125643 A1 | 7/2004 | Kang | |
| 2010/0188891 A1 | 7/2010 | Taniguchi | |
| 2015/0340090 A1* | 11/2015 | Ma | G11C 11/1675 365/148 |
| 2016/0013793 A1* | 1/2016 | Park | H03K 19/0948 365/158 |
| 2019/0348112 A1* | 11/2019 | Gopinath | G11C 11/005 |

FOREIGN PATENT DOCUMENTS

TW 201140590 A1 11/2011

* cited by examiner

*Primary Examiner* — Jerome Leboeuf
(74) *Attorney, Agent, or Firm* — Winston Hsu

(57) ABSTRACT

An non-volatile static random access memory (nvSRAM) is provided in the present invention, including a first pass gate transistor, a second pass gate transistor, a first pull-up transistor, a second pull-up transistor, a first pull-down transistor and a second pull-down transistor, which construct collectively two cross-coupled inverters with two storage nodes, wherein resistive random-access memories (RRAM) are set between the first storage node, the first pull-up transistor and the first pull-down transistor and between the second storage node, the second pull-up transistor and the second pull-down transistor.

14 Claims, 13 Drawing Sheets

NON-VOLATILE STATIC RANDOM ACCESS MEMORY INCORPORATING RESISTIVE RANDOM-ACCESS MEMORY

BACKGROUND OF THE INVENTION

1. Field of the Invention

The present invention generally relates to a non-volatile static random access memory (nvSRAM), and more specifically, to a nvSRAM using resistive random-access memory (RRAM).

2. Description of the Prior Art

Static random access memory (SRAM) is a type of random-access memory. The term "static" means the data stored in this memory may be preserved as long as the power is sustained. On the contrary, dynamic random-access memory (DRAM) must be periodically refreshed to keep the stored data. However, SRAM is also a kind of volatile memory, which means its stored data would be loss if the power is cut off. This property is quite different from those read only memory (ROM) or flash memory, whose stored data may be preserved after power cut-off.

SRAM is provided with the advantages of low read voltage ($V_{DD}$<1V) and high access speed (<10 ns), but its volatile property make it unable to be used in the application of long-term storage in power-off condition. In some essential applications like internet, aerospace or medical fields, it requires the memory device with all of aforementioned advantages. The non-volatile SRAM (nvSRAM) therefore emerges as the times require. The nvSRAM covers a wide range of application fields, since it not only solves the problem that the SRAM can't permanently preserve the stored data, but also fulfills the purposes of low power consumption and high-speed access.

There are many approaches to implement a nvSRAM. One of them is to transfer the data value stored in nvSRAM to other non-volatile memory like flash, magnetoresistive random access memory (MRAM) or phase-change memory (PCM), through storage actions before the power of entire block or module of the memory is cut off, and the transferred data value may be extracted thereafter through restore action, thereby achieving the effect of non-volatile storage. Nevertheless, at present the aforementioned approach can't render the nvSRAM with all of essential advantages like high-speed access, low operation voltage and low power consumption. It still requires those of skilled in the art to further develop and improve the architecture of current nvSRAM.

SUMMARY OF THE INVENTION

In the light of the aforementioned current situation of conventional skill, the present invention hereby provides a novel non-volatile static random access memory (nvSRAM), featuring resistive random-access memories (RRAM) set between normal SRAM storage nodes and pull-up transistors and between normal SRAM storage nodes and pull-down transistors. These RRAMs are set at positions once for setting contacts and overlap with the drains of these transistors, so as to achieve competitive advantages of high speed access, low operation voltage and low power consumption, without increasing required layout area.

One aspect of the present invention is to provide a non-volatile static random access memory, including structures of: a first pass gate transistor with a first gate, a first source and a first drain, wherein the first source is connected with a bit line, and the first gate is connected with a word line; a second pass gate transistor with a second gate, a second source and a second drain, wherein the second source is connected with a complementary bit line, and the second gate is connected with a word line; a first pull-up transistor with a third gate, a third source and a third drain, wherein the third source is connected to a first common power line; a second pull-up transistor with a fourth gate, a fourth source and a fourth drain, wherein the fourth source is connected to the first common power line; a first pull-down transistor with a fifth gate, a fifth source and a fifth drain, wherein the fifth source is connected to a second common power line; and a second pull-down transistor with a sixth gate, a sixth source and a sixth drain, wherein the sixth source is connected to the second common power line, wherein the first drain, the fourth gate and the six gate are connected to a first storage node, and the second drain, the third gate and the fifth gate are connected to a second storage node, and a first resistive random-access memory (RRAM) is set between the first storage node and the third drain, and a second RRAM is set between the first storage node and the fifth drain, and a third RRAM is set between the second storage node and the fourth drain, and a fourth RRAM is set between the second storage node and the sixth drain.

Another aspect of the present invention is to provide a method of operating the aforementioned non-volatile static random access memory, including forming operation, clear operation, write operation and read operation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
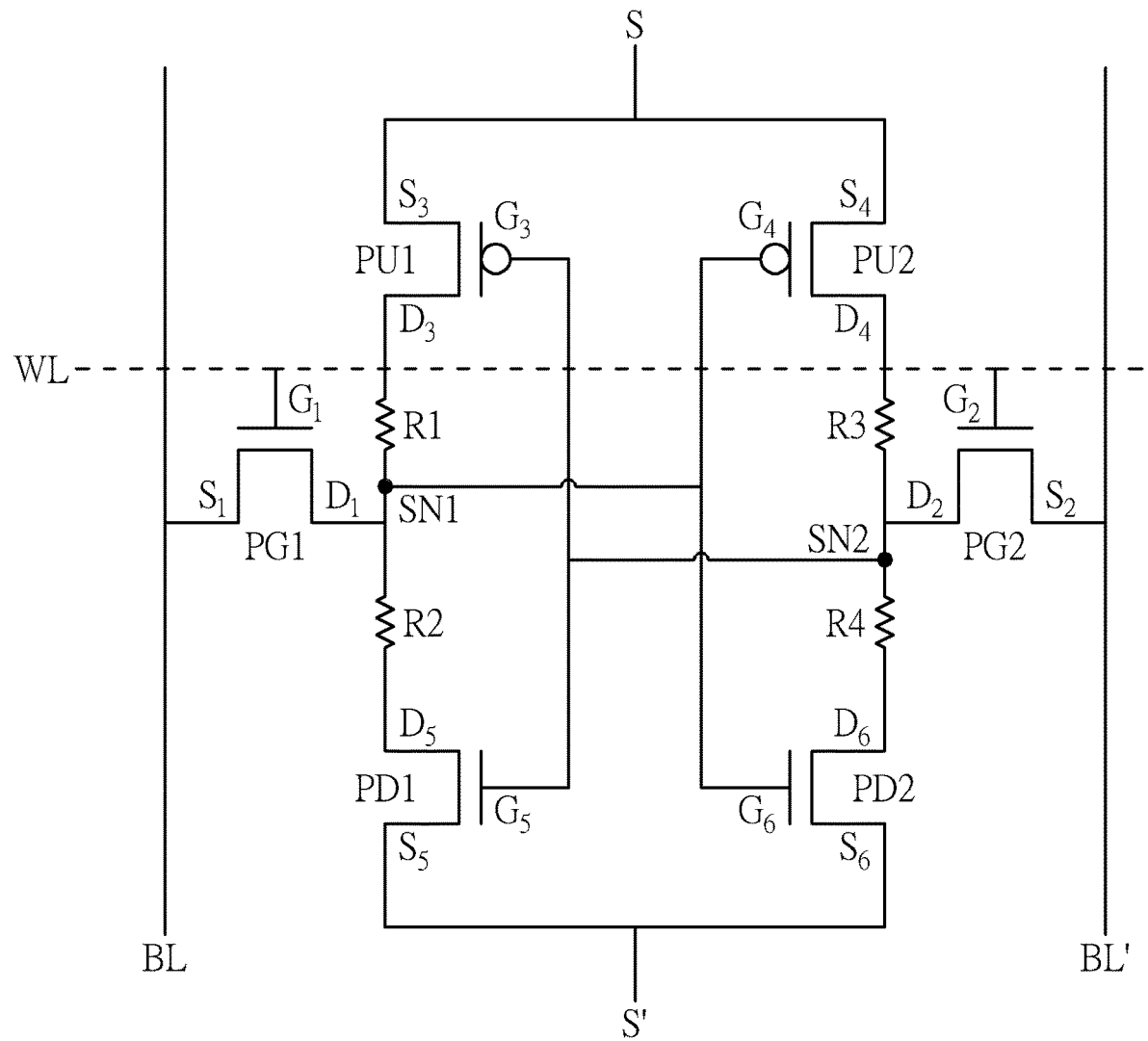
FIG. 1 is a circuit schematic of a non-volatile static random access memory (nvSRAM) in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above"/or "over" something but can also include the meaning it is "above" or "over" something with no intermediate feature or layer therebetween (i.e., directly on something).

In addition, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

First, Please refer to FIG. 1, which is a circuit schematic of a non-volatile static random access memory (nvSRAM) in accordance with the preferred embodiment of present invention. The non-volatile static random access memory of the present invention includes six field effect transistors (FETs) and four capacitors (6T4C architecture), wherein four of these FETs (first and second pull-up transistors PU1, PU2 and first and second pull-down transistors PD1, PD2) constitute two cross-coupled inverters. The two inverters are symmetrical to each other and latch the data of "0" and "1" to achieve the effect of data storage. The four capacitors are set respectively between the storage nodes and the four FETs to serve as non-volatile memory units, while the other two FETs (first and second pass gate transistors PG1, PG2) functions as control switches of bit lines for read, write and clear operations.

As shown in FIG. 1, the six FETs in the nvSRAM are all consisted of a gate, a source and a drain, wherein the sources $S_1$, $S_2$ of first pass gate transistor PG1 and second pass gate transistor PG2 are connected respectively with a bit line BL and a complementary bit line BL', and the drains $D_1$, $D_2$ are connected respectively with a first storage node SN1 and a second storage node SN2, and the gates $G_1$, $G_2$ are connected to a common word line WL. The sources $S_3$, $S_4$ of first pull-up transistor PU1 and second pull-up transistor PU2 are connected to a first common power line 5, and the drains $D_3$, $D_4$ are connected respectively with first storage node SN1 and second storage node SN2. In the preferred embodiment of present invention, a first resistive random access memory (RRAM) R1 is set between the drain $D_3$ of first pull-up transistor PU1 and the first storage node SN1, and a third RRAM R3 is set between the drain $D_4$ of second pull-up transistor PU2 and the second storage node SN2. In similar way, the sources $S_5$, $S_6$ of first pull-down transistor PD1 and second pull-down transistor PD2 are connected to a second common power line S', and the drains $D_5$, $D_6$ are connected respectively with first storage node SN1 and second storage node SN2, and a second RRAM R2 is set between the drain $D_5$ of first pull-down transistor PD1 and the first storage node SN1, and a fourth RRAM R4 is set between the drain $D_6$ of second pull-down transistor PD2 and the second storage node SN2. In this way, a total of four RRAMs R1-R4 are set in the nvSRAM of present invention, which are positioned respectively between the storage nodes and every pull-up transistors and pull-down transistors, to achieve the effect of non-volatile storage. Furthermore, in addition to the drain $D_1$ of first pass gate transistor PG1, the first RRAM R1 and the second RRAM R2, the first storage node SN1 is further connected with the gate $G_4$ of second pull-up transistor PU2 and the gate $G_6$ of second pull-down transistor PD2. In addition to the drain $D_2$ of second pass gate transistor PG2, the third RRAM R3 and the fourth RRAM R4, the second storage node SN2 is further connected with the gate $G_3$ of first pull-up transistor PU1 and the gate $G_5$ of first pull-down transistor PD1, in order to achieve the effect of mutual latching. In the embodiment of present invention, the two pull-up transistors PU1 and PU2 may be PMOS transistors, while the two pull-down transistors PD1 and PD2 may be NMOS transistors.

Figure 2:
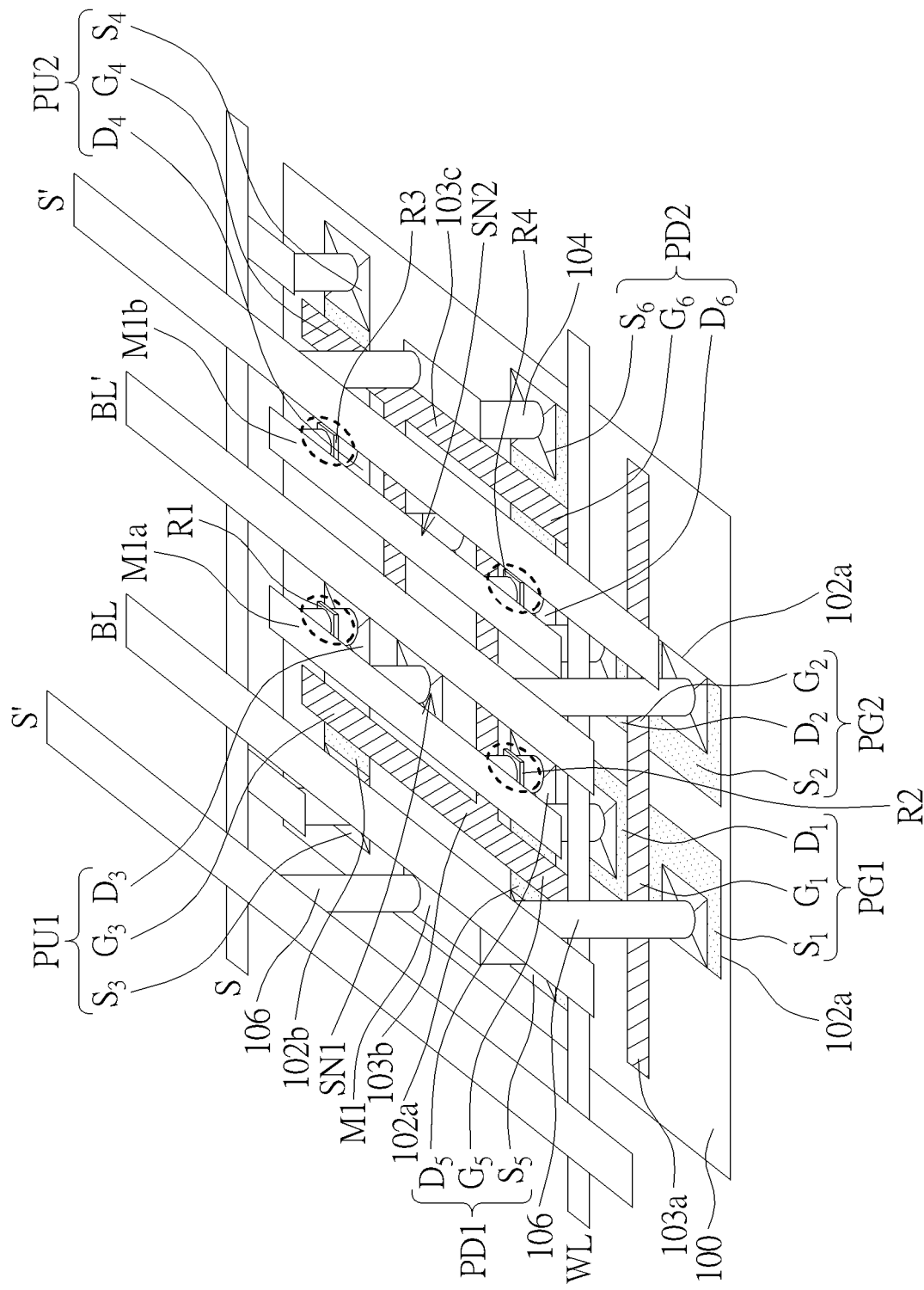
FIG. 2 is a 3D isometric drawing of the circuit of a non-volatile static random access memory in accordance with the preferred embodiment of the present invention.

Please refer now to FIG. 2, which is a 3D isometric drawing of the circuit of the aforementioned RRAM for describing detailedly the relative positions and connections of every component in the nvSRAM of present invention. As shown in FIG. 2, the nvSRAM of present invention is set on a substrate 100. The substrate 100 may be any component with carrier function, for example a semiconductor substrate, including silicon-based substrate, silicon-on-insulator (SOI) substrate or sapphire substrate, but not limited thereto. Multiple separate n-type doped regions 102a and p-type doped regions 102b are formed in the substrate 100 through doping method to serve as sources, drains and channels of transistors. Multiple polysilicon strip patterns 103 formed on the substrate 100 respectively cross those doped regions to function as the gates of those transistors. Take the first pass gate transistor PG1 as an example, its gate $G_1$ is a polysilicon pattern 103a across the n-type doped region 102a. The n-type doped regions 102a at two sides of the gate $G_1$ are its source $S_1$ and drain $D_1$, respectively. A word line WL is set above the polysilicon pattern 103a and connected with the gate $G_1$ through a contact (not shown) to control the switch of first pass gate transistor PG1. The source $S_1$ of first pass gate transistor PG1 is connected to a bit line BL above through interconnects like via 106. In this embodiment, word line WL may be in the level of first metal layer M1, while bit line BL may be in the level of second metal layer M2.

Refer still to FIG. 2. In the embodiment of present invention, a first pull-down transistor PD1 is set adjacent to the first pass gate transistor PG1 and uses different n-type doped region 102a. The drain $D_5$ of first pull-down transistor PD1 is connected with the drain $D_1$ of first pass gate transistor PG1 through contacts and a first metal layer M1a. Similarly, the polysilicon pattern 103b crosses over the n-type doped region 102a to function as a gate $G_5$ of first pull-down transistor PD1, and the other side of the gate $G_5$ is the source $S_5$ of first pull-down transistor PD1. In this embodiment, the source $S_5$ of first pull-down transistor PD1 is connected to the second power line S' above through interconnects like a contact, the first metal layer M1 and a via 106. The second power line S' may be in the level of second metal layer M2.

Refer still to FIG. 2. In the embodiment of present invention, the first pull-up transistor PU1 and the first pull-down transistor PD1 are spaced apart by a distance and use separate p-type doped regions 102b. The gate $G_3$ of first pull-up transistor PU1 and the gate $G_5$ of first pull-down transistor PD1 may share the same polysilicon pattern 103b, that is, the gates of two transistors are connected with each other. The source $S_3$ of first pull-up transistor PU1 is connected to a metal wire of first power line S above through a contact, while the drain $D_3$ of first pull-up transistor PU1 is connected with the drain $D_5$ of first pull-down transistor PD1 and the drain $D_1$ of first pass gate transistor PG1 through contacts and first metal layers M1a. The first power line S may be in the level of first metal layer M1.

In this embodiment, the second pass gate transistor PG2, the second pull-down transistor PD2 and the second pull-up transistor PU2 are set in a completely mirror symmetry to the first pass gate transistor PG1, the first pull-down transistor PD1 and the first pull-up transistor PU1 with identical components and structures in the opposite positions. It should be noted that, as shown in the figure, the gate of polysilicon pattern 103b shared by the first pull-up transistor PU1 and the first pull-down transistor PD1 is further provided with a branch extending in the direction of second pull-down transistor PD2 and connected with the drain $D_6$ of second pull-down transistor PD2, the drain $D_4$ of second pull-up transistor PU2 and the drain $D_2$ of second pass gate transistor PG2 through contacts and first metal layers M1b. Similarly, the gate of polysilicon pattern 103c shared by the second pull-up transistor PU2 and the second pull-down transistor PD2 is also further provided with a branch extending in the direction of first pull-down transistor PD1 and connected with the drain $D_5$ of first pull-down transistor PD1, the drain $D_3$ of first pull-up transistor PU1 and the drain $D_1$ of first pass gate transistor PG1 through contacts and first metal layers M1a, so as to achieve the effect of mutual latching of the two inverters. The position that the extending branch of polysilicon pattern 103b intersects the first metal layer M1b between the drain $D_4$ of second pull-up transistor PU2 and the drain $D_6$ of second pull-down transistor PD2 is the second storage node SN2 of SRAM. The position that the extending branch of another polysilicon pattern 103c intersects the first metal layer M1a between the drain $D_3$ of first pull-up transistor PU1 and the drain $D_5$ of first pull-down transistor PD1 is the first storage node SN1 of SRAM. The second power line S' connected by the source $S_5$ of first pull-down transistor PD1 and the source $S_6$ of second pull-down transistor PD2 may be a common power line, and the first power line S connected by the source $S_3$ of first pull-up transistor PU1 and the source $S_4$ of second pull-up transistor PU2 may be a common power line. However, the source $S_1$ of first pass gate transistor PG1 and the source $S_2$ of second pass gate transistor PG2 are connected respectively to a bit line BL and a complementary bit line BL'.

The present invention features the using of RRAMs to render the volatile SRAM with non-volatile storage function. The approach is to set RRAMs between the two storage nodes SN1, SN2 and the drains of transistors connected therewith. These RRAMs are set at positions once for setting contacts and overlap with the connected drains, so that required layout area is not increased. As shown in FIG. 2, the first RRAM R1 is set at the contact position between the drain $D_3$ of first pull-up transistor PU1 and the first metal layer M1a, and the second RRAM R2 is set at the contact position between the drain $D_5$ of first pull-down transistor PD1 and the first metal layer M1a, and the first storage node SN1 is connected with the top electrode of first RRAM R1 and the top electrode of second RRAM R2 through the first metal layers M1a. The third RRAM R3 is set at the contact position between the drain $D_4$ of second pull-up transistor PU2 and the first metal layer M1b, and the fourth RRAM R4 is set at the contact position between the drain $D_6$ of second pull-down transistor PD2 and the first metal layer M1b, and the second storage node SN2 is connected with the top electrode of third RRAM R3 and the top electrode of fourth RRAM R4 through the first metal layers M1b.

Figure 3:
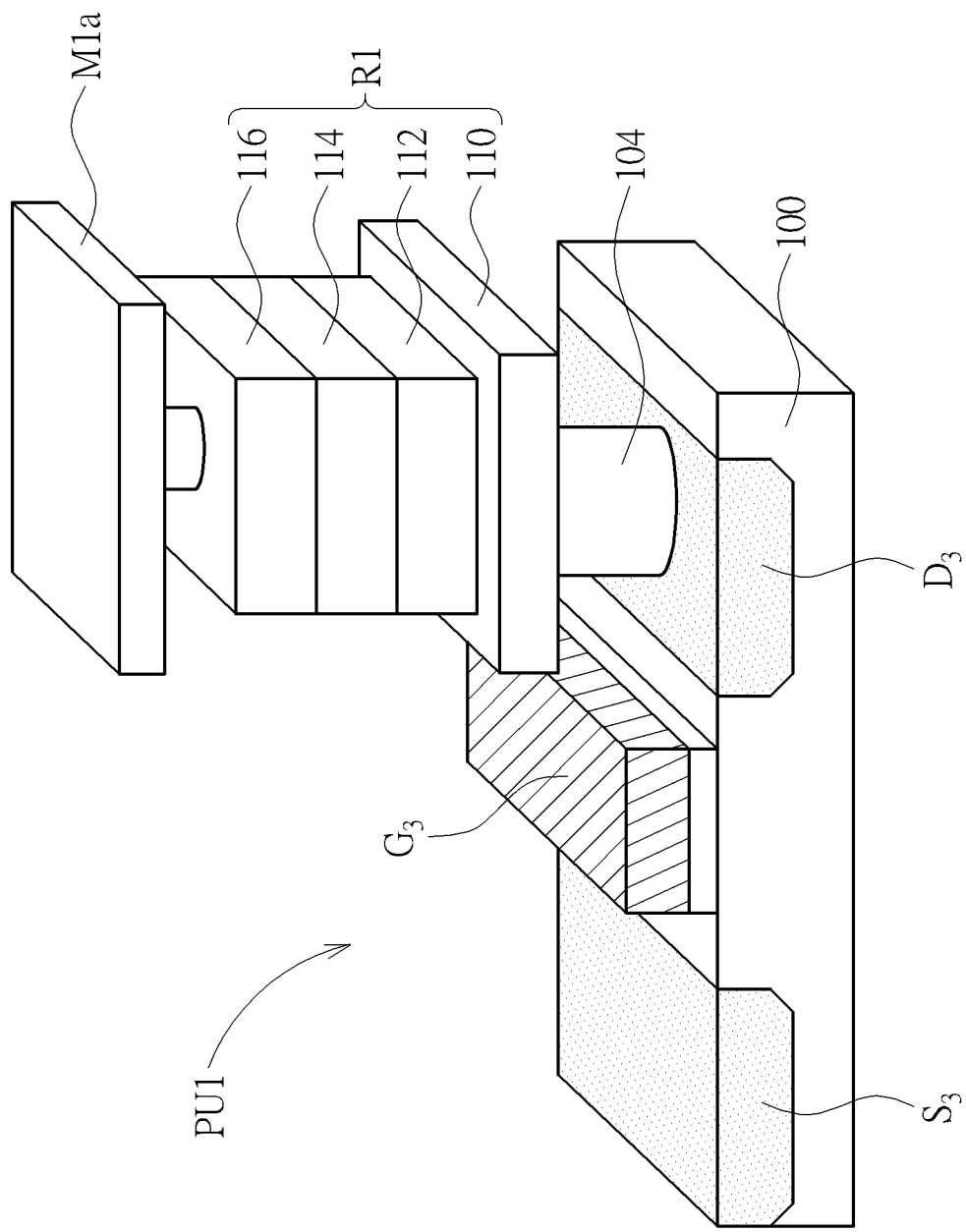
FIG. 3 is a 3D isometric drawing illustrating the connection of a resistive random-access memory (RRAM) and a transistor in a non-volatile static random access memory in accordance with the preferred embodiment of the present invention.

Please refer now to FIG. 3, which is a 3D isometric drawing illustrating the connection of a RRAM and a transistor in a nvSRAM in accordance with the preferred embodiment of the present invention, in order to detailedly show the setting of the RRAMs in the SRAM of present invention. Take the first pull-up transistor PU1 as an example, as shown in FIG. 3, the bottom electrode of first RRAM R1 is connected right above the drain $D_3$ of first pull-up transistor PU1 through a contact 104 (shorter than normal contact), and the top electrode of first RRAM R1 may be connected with a first metal layer M1a above through another short contact. Since the position of first RRAM R1 is a regular position for setting the contact and overlaps the drain $D_3$ of first pull-up transistor PU1, so that required layout area is not increased. In the embodiment of present invention, the RRAM is an unipolar RRAM, which may be consisted of a top electrode, a bottom electrode and a capacitive dielectric layer between the top electrode and the bottom electrode, wherein the capacitive dielectric layer has different resistances depending on the applied bias voltage. For example, the top electrode may be a composite layer of titanium nitride layer 116/titan layer 114, and the bottom electrode 110 may be a titanium nitride layer, and the capacitive dielectric layer 112 may be a hafnium oxide ($HfO_2$) layer or nickel oxide (NiO) layer. Alternatively, the top electrode and bottom electrode may be platinum (Pt) metal layers, and the capacitive dielectric layer may be silicon oxide layer or metal oxide layer.

Figure 4:
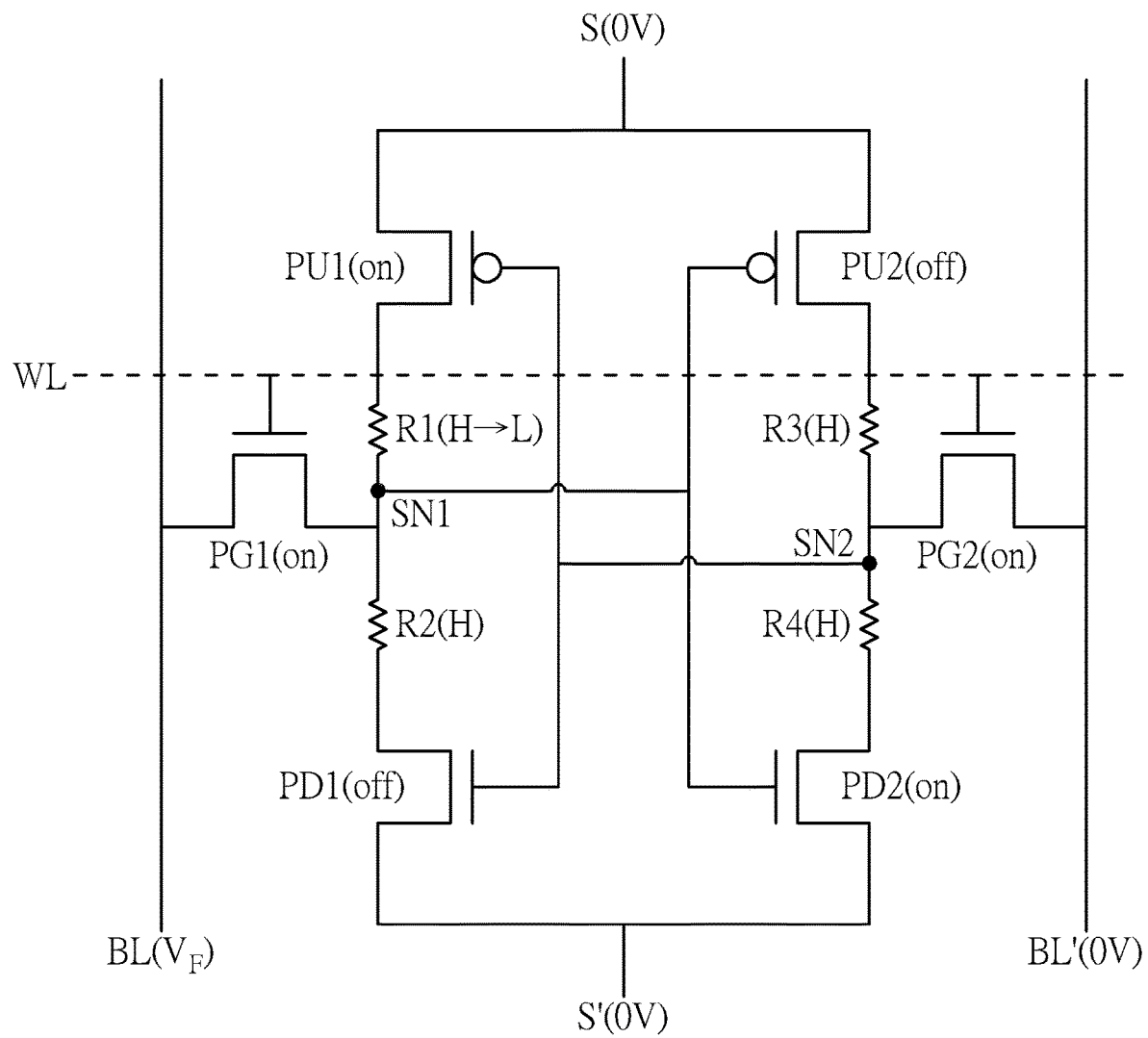
FIG. 4 to FIG. 6 are circuit schematics of the non-volatile static random access memory in every step of the forming operation in accordance with the preferred embodiment of the present invention.
Figure 5:
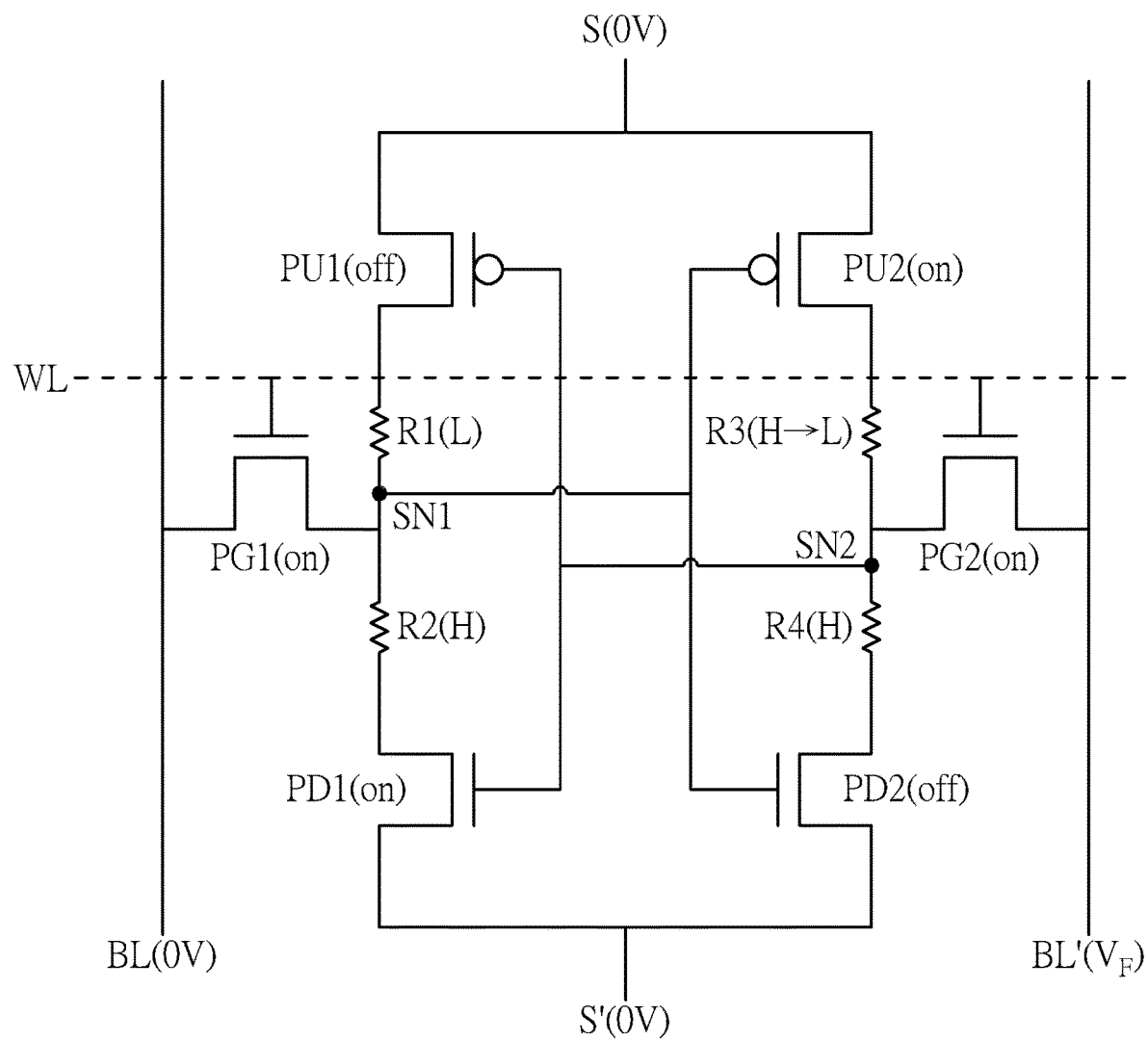
Figure 6:
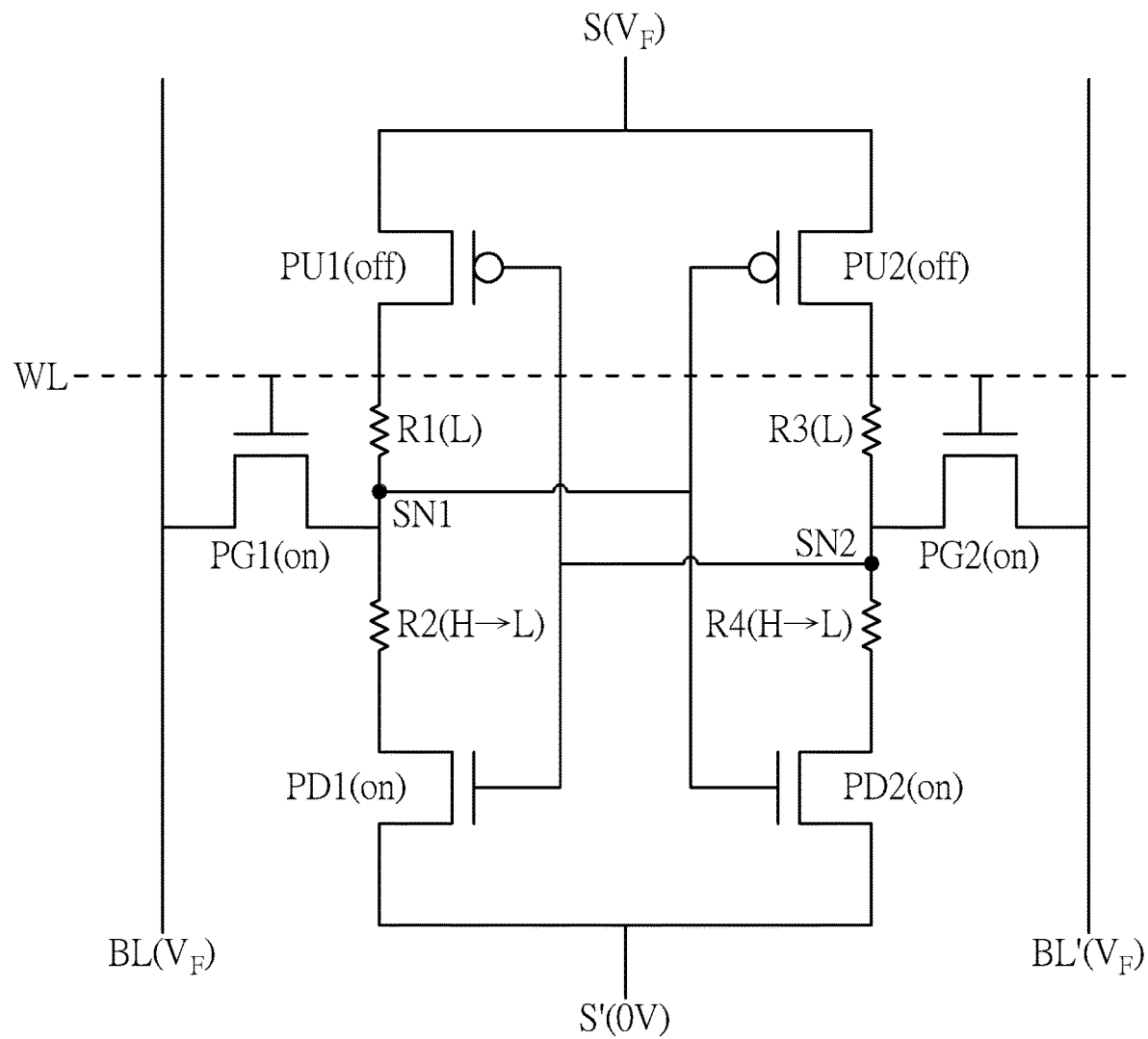

After the structural features of nvSRAM of the present invention is described, the operation mechanism of nvSRAM of the present invention will now be described in following embodiments. FIG. 4 to FIG. 6 are circuit schematics of the nvSRAM in every step of the forming operation in accordance with the preferred embodiment of the present invention. First, please refer to FIG. 4. In the first step of forming operation, a forming voltage $V_F$ is applied from the bit line BL and a voltage of 0V is applied respectively from the complementary bit line BL', the first power line S and the second power line S'. Please note that, in the preferred embodiment of present invention, the aforementioned forming voltage $V_F$ is designedly a threshold voltage enabling the formation of filaments in the capacitive dielectric layer (i.e. 112 in FIG. 3) of the RRAMs in SRAM and transform the capacitive dielectric layer from original insulating property into variable resistance property. In the condition that the two pass gate transistors PG1, PG2 are both opened by the word line WL, the voltage at first storage node SN1 is equal to the forming voltage $V_F$ and the voltage of second storage node SN2 is 0V, so as to render the transistors PU1, PD2 connected therewith in ON state and the transistors PD1, PU2 in OFF state (please note that in this embodiment the pull-up transistors PU1, PU2 are PMOS and the pull-down transistors PD1, PD2 are NMOS). In this way, there will be a voltage difference equal to the forming voltage $V_F$ between the drain of first pull-up transistor PU1 in ON state and the first storage node SN1, so as to change the resistance of capacitive dielectric layer in the first RRAM R1 there from original high level state into low level state (H->L). The storage states of other RRAMs are unchanged since the voltage difference at these RRAMs are not sufficient or the transistors connected therewith are not opened.

Refer next to FIG. 5. In the second step of forming operation, the forming voltage $V_F$ is applied from the complementary bit line BL' and a voltage of 0V is applied respectively from the bit line BL, the first power line S and the second power line S'. In the condition that the two pass gate transistors PG1, PG2 are both opened by the word line WL, the voltage at first storage node SN1 is 0V and the voltage of second storage node SN2 is equal to the forming voltage $V_F$, so as to render the transistors PU2, PD1 connected therewith in ON state and the transistors PD2, PU1 in OFF state. In this way, there will be a voltage difference equal to the forming voltage $V_F$ between the drain of second pull-up transistor PU2 in ON state and the second storage node SN2, so as to change the resistance of capacitive dielectric layer in the third RRAM R3 there from original high level state into low level state (H->L). The storage states of other RRAMs are unchanged since the voltage difference at these RRAMs are not sufficient or the transistors connected therewith are not opened.

Refer next to FIG. 6. In the third step of forming operation, a voltage $V_F$ equal to the forming voltage is applied respectively from the bit line BL, the complementary bit line BL' and the first power line S, and a voltage of 0V is applied from the second common power line S'. In the condition that the two pass gate transistors PG1, PG2 are both opened by the word line WL, the voltages at first storage node SN1 and second storage node SN2 are both equal to the forming voltage $V_F$, so that the transistors PD1, PD2 are rendered in ON state and the transistors PU1, PU2 are rendered in OFF state. In this way, there will be voltage differences equal to the forming voltage $V_F$ between the drain of first pull-down transistor PD1 in ON state and the first storage node SN1 connected therewith and between the drain of second pull-down transistor PD2 in ON state and the second storage node SN2 connected therewith, so as to change the resistances of capacitive dielectric layers in the second RRAM R2 and the fourth RRAM R4 there from original high level state into low level state (H->L).

Through the aforementioned three steps of FIG. 4 to FIG. 6, the four RRAMs R1-R4 are all transformed from original high level state into low level state (H->L). That is, filaments are formed within the capacitive dielectric layer thereof and transform the capacitive dielectric layer from original insulating property into variable resistance property.

Figure 7:
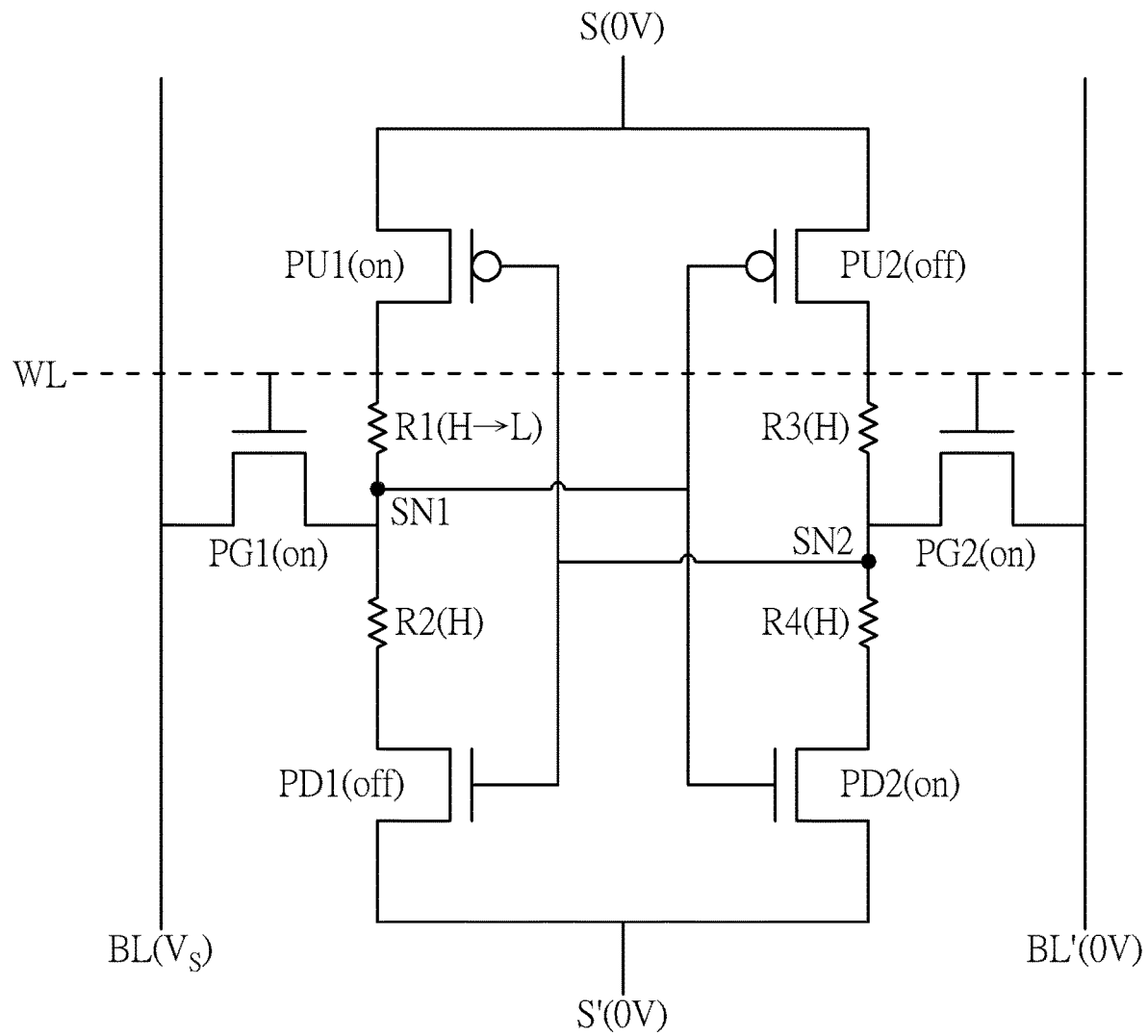
FIG. 7 to FIG. 9 are circuit schematics of the non-volatile static random access memory in every step of the clear operation in accordance with the preferred embodiment of the present invention.
Figure 8:
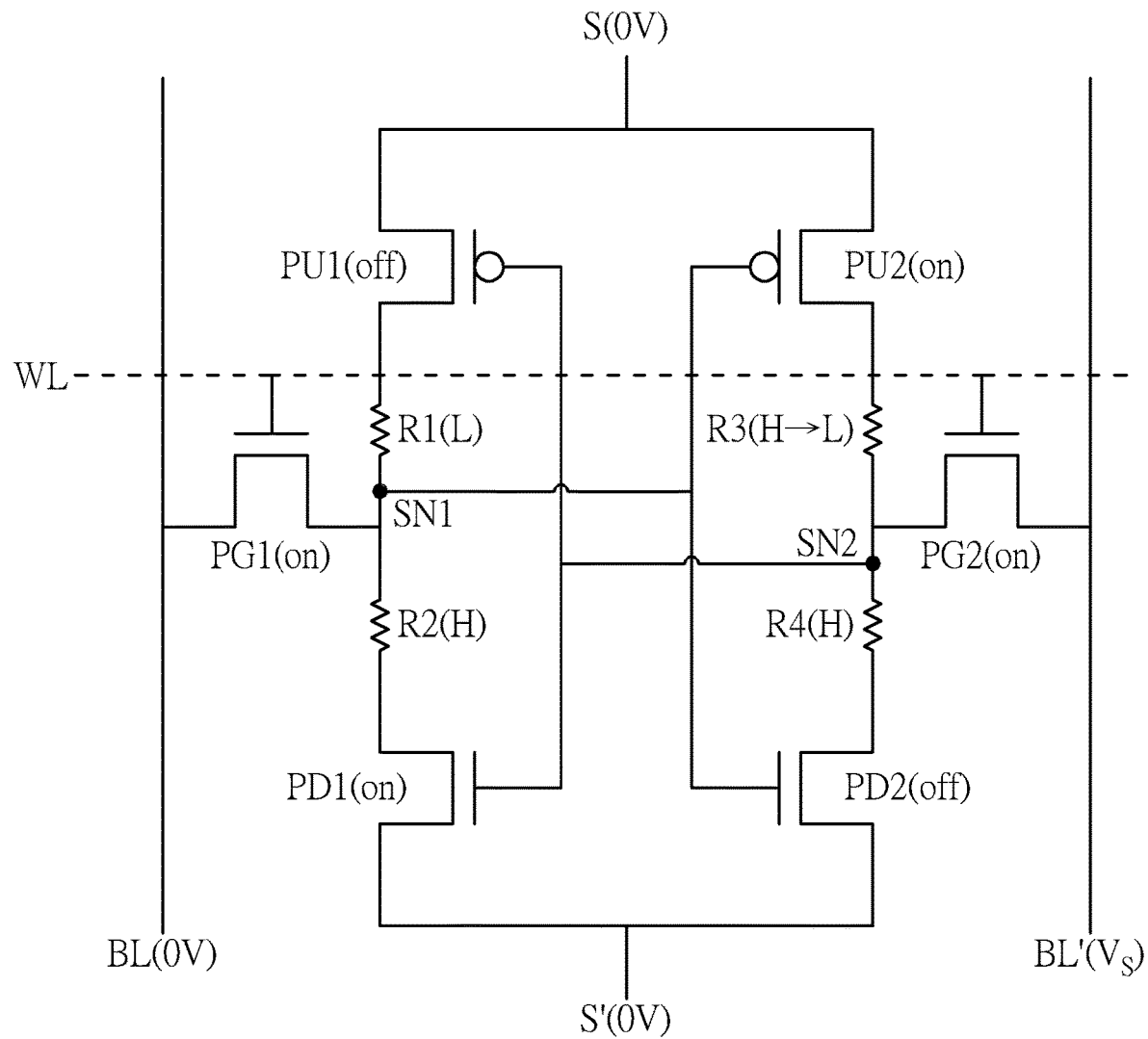
Figure 9:
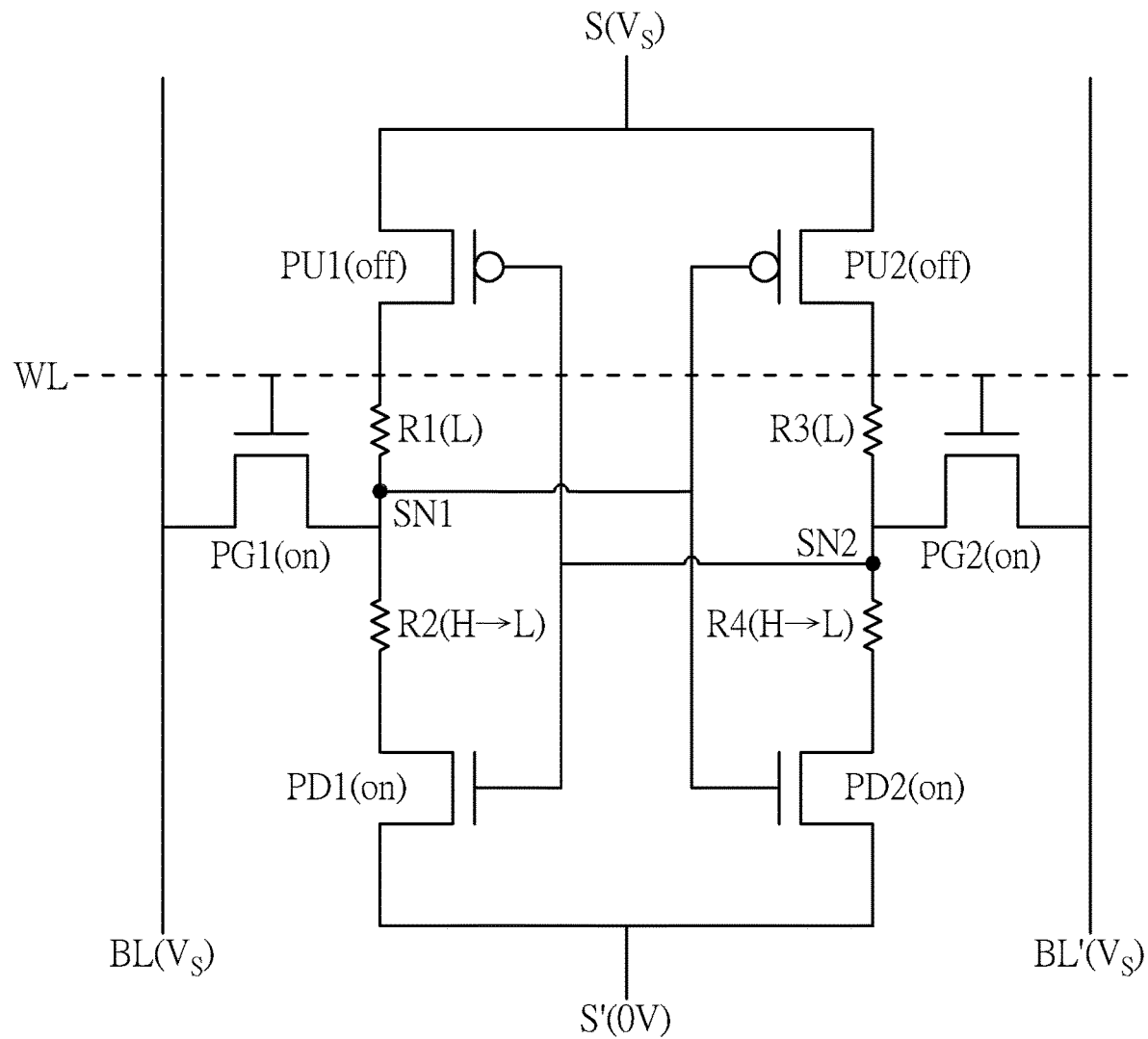

Refer next to FIG. 7 to FIG. 9, which are circuit schematics of the nvSRAM in every step of the clear operation in accordance with the preferred embodiment of the present invention. Generally, the clear operation of nvSRAM of the present invention is almost the same as the aforementioned forming operation, with the difference that the purpose of clear operation is to reset and unify all of the states of RRAM memory units in the nvSRAM into low level state L, in order to facilitate the subsequent write operation under the SRAM architecture. In the embodiment of present invention, the forming operation and the clear operation are conducted in the same way, with difference that the clear voltage $V_S$ applied in the clear operation is lower than the forming voltage $V_F$. Other features of these two operations are the same, so no more details will be herein repeated.

Figure 10:
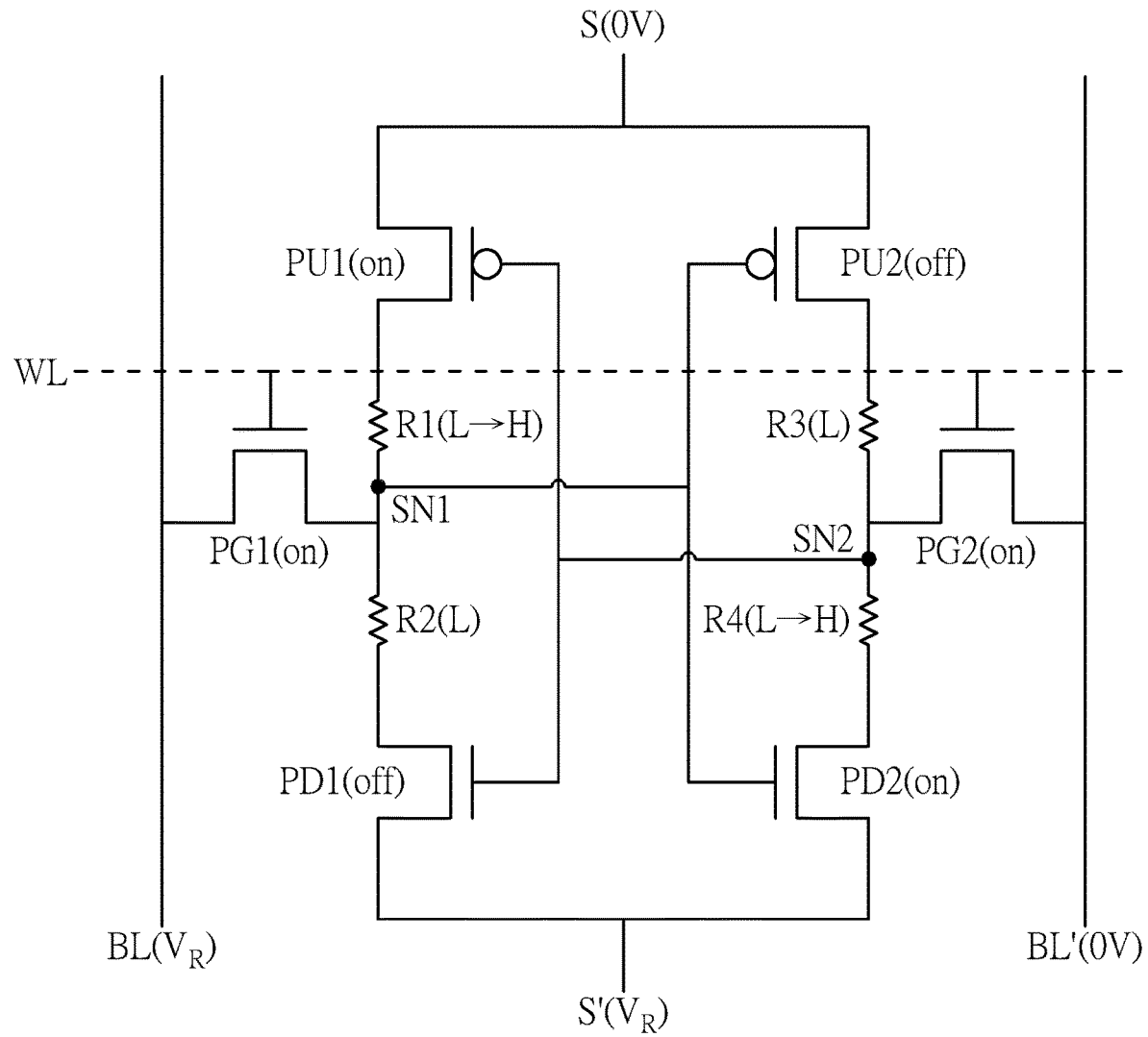
FIG. 10 to FIG. 11 are circuit schematics of the non-volatile static random access memory in every step of the write operation in accordance with the preferred embodiment of the present invention.
Figure 11:
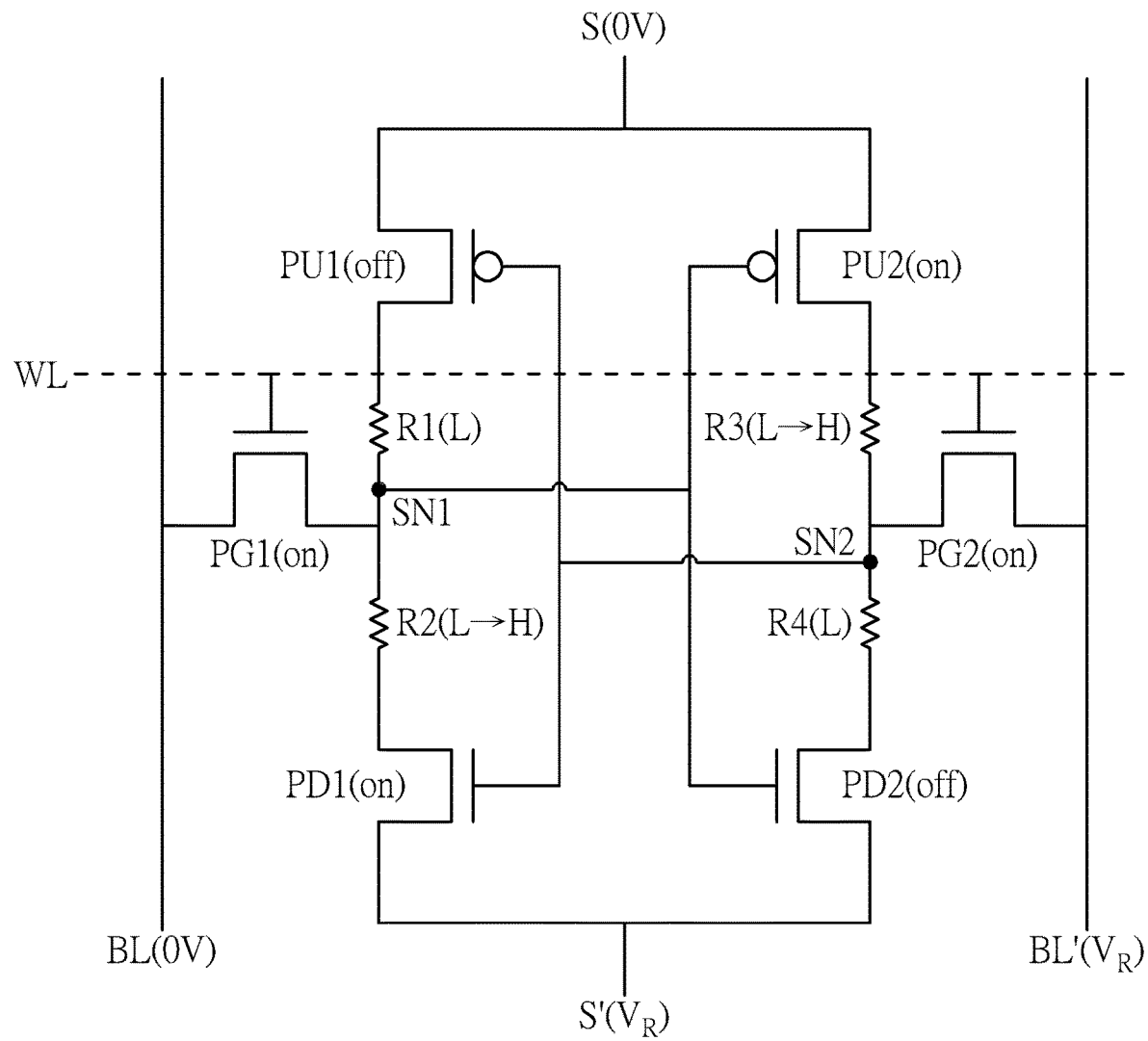

Refer next to FIG. 10 to FIG. 11, which are circuit schematics of the nvSRAM in every step of the write operation in accordance with the preferred embodiment of the present invention. The write operation of SRAM may be conducted in two modes, wherein the write process in both modes are began in the condition that the RRAM memory units are already in low level state L after the forming operation and the clear operation are conducted. First, please refer to FIG. 10. A write voltage $V_R$ is applied respectively from the bit line BL and the second power line S' and a voltage of 0V is applied respectively from the complementary bit line BL' and the first power line S. In the condition that the two pass gate transistors PG1, PG2 are both opened by the word line WL, the voltage at first storage node SN1 is $V_R$ and the voltage at second storage node SN2 is 0V, so that the transistors PU1, PD2 are rendered in ON state and the transistors PD1, PU2 are rendered in OFF state. In this way, there will be a voltage difference equal to the write voltage $V_R$ between the drain of first pull-up transistor PU1 in ON state and the first storage node SN1, so as to change the resistance of capacitive dielectric layer in the first RRAM R1 there from original low level state into high level state (L->H). Similarly, there will be a voltage difference equal to the write voltage $V_R$ between the drain of second pull-down transistor PD2 in ON state and the second storage node SN2, so as to change the resistance of capacitive dielectric layer in the fourth RRAM R4 there from original low level state into high level state (L->H). The SRAM may be defined as being in "0" logic state when the first RRAM R1 and the fourth RRAM R4 are in high level state and the second RRAM R2 and the third RRAM R3 are in low level state.

Please refer to FIG. 11. Different from FIG. 10, the write voltage $V_R$ is applied respectively from the complementary bit line BL' and the second power line S' and a voltage of 0V is applied from the bit line BL and the first power line S. In the condition that the two pass gate transistors PG1, PG2 are both opened by the word line WL, the voltage at first storage node SN1 is 0V and the voltage at second storage node SN2 is $V_R$, so that the transistors PU2, PD1 are rendered in ON state and the transistors PD2, PU1 are rendered in OFF state.

In this way, there will be a voltage difference equal to the write voltage $V_R$ between the drain of second pull-up transistor PU2 in ON state and the second storage node SN2, so as to change the resistance of capacitive dielectric layer in the third RRAM R3 there from original low level state into high level state (L->H). Similarly, there will be a voltage difference equal to the write voltage $V_R$ between the drain of first pull-down transistor PD1 in ON state and the first storage node SN1, so as to change the resistance of capacitive dielectric layer in the second RRAM R2 there from original low level state into high level state (L->H). The SRAM may be defined as being in "1" logic state when the second RRAM R2 and the third RRAM R3 are in high level state and the first RRAM R1 and the fourth RRAM R4 are in low level state.

The value of aforementioned forming voltage $V_F$, clear voltage $V_S$ and write voltage $V_R$ are related to the material of capacitive dielectric layer, but the values of these three voltages comply with the rule of $V_F>V_S>V_R$ and are all greater than the operation voltage $V_{dd}$. Take halfnium oxide layer as an example, its forming voltage $V_F$ is approximately 3V, its clear voltage $V_S$ is approximately 2.4V and its write voltage $V_R$ is approximately 1.8V.

Figure 12:
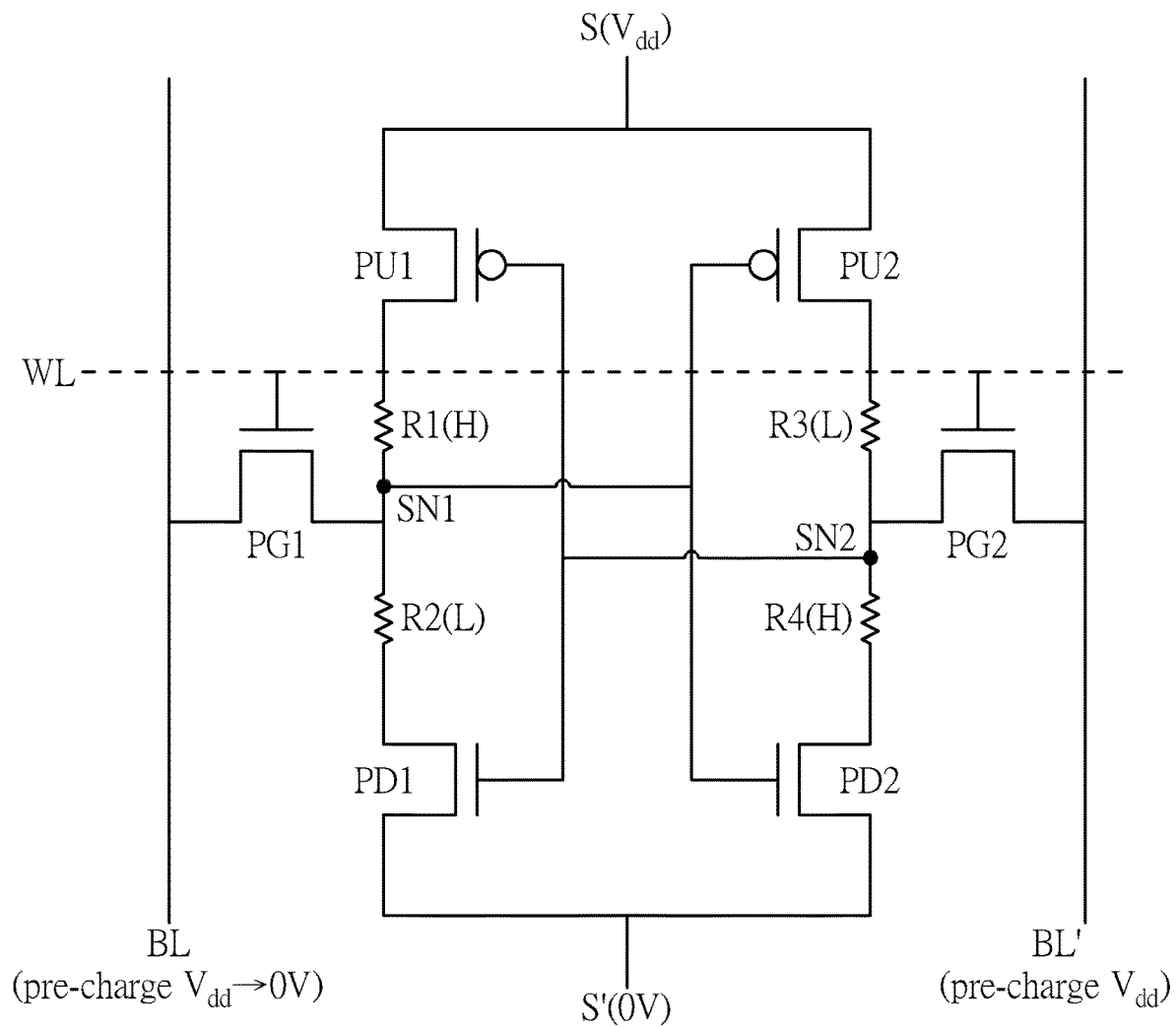
FIG. 12 to FIG. 13 are circuit schematics of the non-volatile static random access memory in every step of the read operation in accordance with the preferred embodiment of the present invention.
Figure 13:
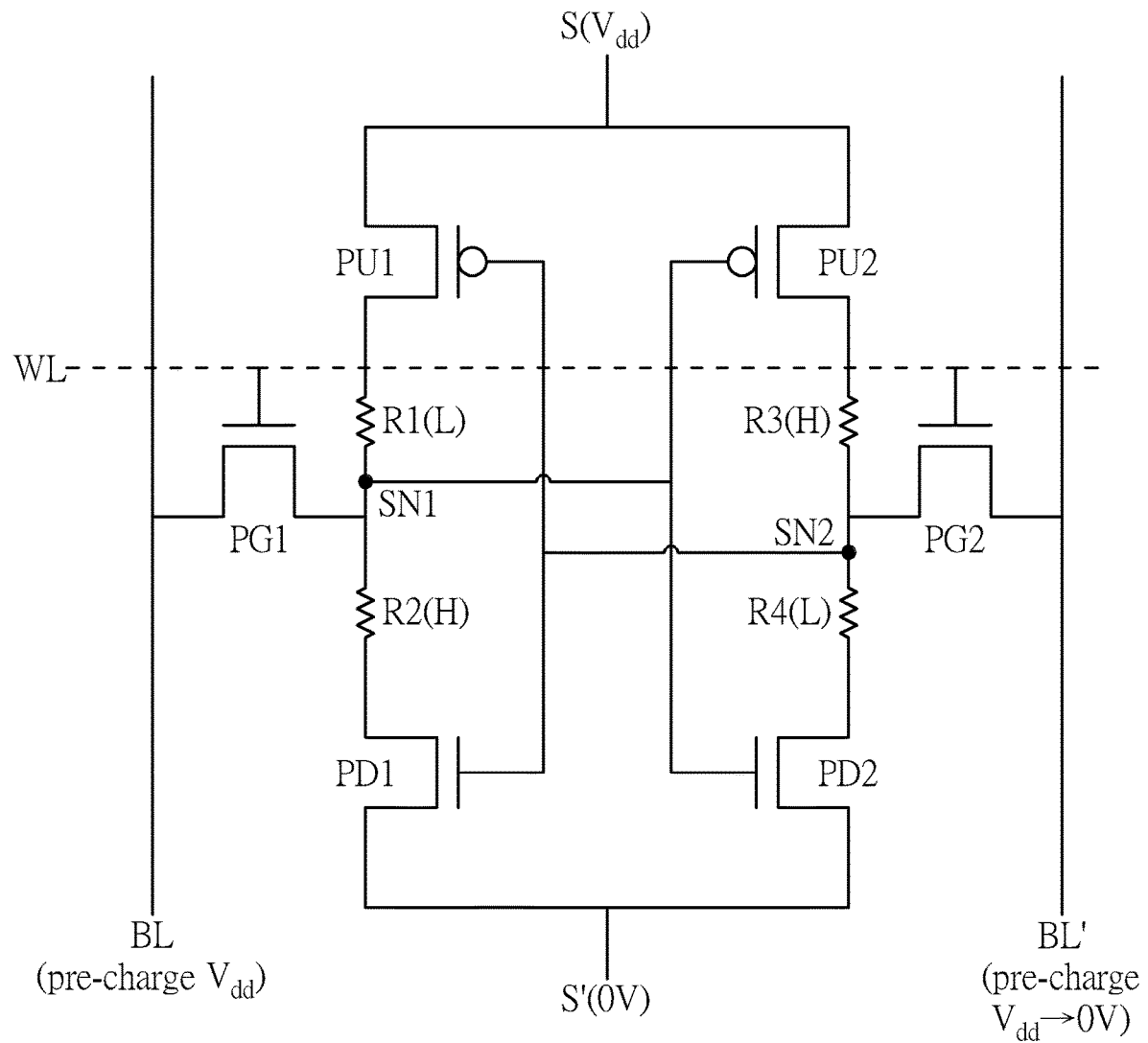

Please refer next to FIG. 12 to FIG. 13, which are circuit schematics of the nvSRAM in every step of the read operation in accordance with the preferred embodiment of the present invention. In the read operation of SRAM, a pre-charge voltage is applied from the bit line BL and the complementary bit line BL', and the logic state of the SRAM is determined by the change of the voltage in the operation. First, please refer to FIG. 12, which is a condition of reading a circuit with predefined "0" logic state. As shown in FIG. 12, a pre-charge voltage ($V_{dd}$) equal to the operation voltage is applied respectively from the bit line BL and the complementary bit line BL', and a voltage ($V_{dd}$) equal to the operation voltage is also applied from the first power line S, while a voltage of 0V is applied from the second power line S'. In the condition that the two pass gate transistors PG1, PG2 are both opened by the word line WL, since the first RRAM R1 and the fourth RRAM R4 are in high resistance state (H), the voltage of first pull-up transistor PU1 is separated from the voltage at first storage node SN1 and the voltage of second pull-down transistor PD2 is separated from the voltage at second storage node SN2. Since the second RRAM R2 and the third RRAM R3 are in low resistance state (L), the voltage of first pull-down transistor PD1 and the voltage at first storage node SN1 are conducted with each other through the second RRAM R2, and the voltage of second pull-up transistor PU2 and the voltage at second storage node SN2 are conducted with each other through the third RRAM R3, so that the pre-charge voltage applied from the bit line BL to the first storage node SN1 is grounded and changed into 0V through the first pull-down transistor PD1, and the pre-charge voltage applied from the complementary bit line BL' to the second storage node SN2 is conducted to the first power line S with a voltage $V_{dd}$ through the second pull-up transistor PU2 and hence remains unchanged. The SRAM may therefore be defined as being in "0" logic state according to the result of the voltage of bit line BL changed into 0V and the voltage of complementary bit line BL' remaining in $V_{dd}$ level in the read operation.

On the other hand, in a condition of reading a circuit with predefined "1" logic state as shown in FIG. 13, similarly, a pre-charge voltage ($V_{dd}$) equal to the operation voltage is applied respectively from the bit line BL and the complementary bit line BL', and a voltage ($V_{dd}$) equal to the operation voltage is also applied from the first power line S, while a voltage of 0V is applied from the second power line S'. In the condition that the two pass gate transistors PG1, PG2 are both opened by the word line WL, since the second RRAM R2 and the third RRAM R3 are in high resistance state (H), the voltage of second pull-up transistor PU2 is separated from the voltage at second storage node SN2 and the voltage of first pull-down transistor PD1 is separated from the voltage at first storage node SN1. Since the first RRAM R1 and the fourth RRAM R4 are in low resistance state (L), the voltage of first pull-up transistor PU1 and the voltage at first storage node SN1 are conducted with each other through the first RRAM R1, and the voltage of second pull-down transistor PD2 and the voltage at second storage node SN2 are conducted with each other through the fourth RRAM R4, so that the pre-charge voltage applied from the bit line BL to the first storage node SN1 is conducted to the first power line S with a voltage $V_{dd}$ through the first pull-up transistor PU1 and hence remains unchanged, and the pre-charge voltage applied from the complementary bit line BL' to the second storage node SN2 is grounded and changed into 0V through the second pull-down transistor PD2. The SRAM may therefore be defined as being in "1" logic state according to the result of the voltage of bit line BL remaining in $V_{dd}$ level and the voltage of complementary bit line BL' changed into 0V in the read operation.

In addition to the aforementioned advantages about achieving non-volatile storage function without additional layout area, the circuit design of present invention may also enhance the robustness of memory. For example, please refer to FIG. 12, when the variable resistance property of fourth RRAM R4 is abnormal due to process variation, it may not be completely changed into high level state in the write operation, so that the pre-charge voltage applied from the complementary bit line BL' to the second storage node SN2 is possible to be grounded through the fourth RRAM R4, causing a voltage drop at complementary bit line BL' and therefore possible read errors. In the embodiment of present invention, if this situation happens, the drop of pre-charge voltage at the complementary bit line BL' may be compensated by the voltage ($V_{dd}$) of first power line S conducted therewith, keeping it close to its original pre-charge voltage ($V_{dd}$), thereby preventing the read errors, which is one of the advantages of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile static random access memory, comprising:
   a first pass gate transistor with a first gate, a first source and a first drain, wherein said first source is connected with a bit line, and said first gate is connected with a word line;
   a second pass gate transistor with a second gate, a second source and a second drain, wherein said second source is connected with a complementary bit line, and said second gate is connected with said word line;
   a first pull-up transistor with a third gate, a third source and a third drain, wherein said third source is connected to a first common power line;
   a second pull-up transistor with a fourth gate, a fourth source and a fourth drain, wherein said fourth source is connected to said first common power line;

a first pull-down transistor with a fifth gate, a fifth source and a fifth drain, wherein said fifth source is connected to a second common power line; and a second pull-down transistor with a sixth gate, a sixth source and a sixth drain, wherein said sixth source is connected to said second common power line;

wherein said first drain, said fourth gate and said six gate are connected to a first storage node, and said second drain, said third gate and said fifth gate are connected to a second storage node, and a first resistive random-access memory (RRAM) is set between said first storage node and said third drain, and a second RRAM is set between said first storage node and said fifth drain, and a third RRAM is set between said second storage node and said fourth drain, and a fourth RRAM is set between said second storage node and said sixth drain, and said first common power line and said second common power line apply a forming voltage, a clear voltage, a write voltage and an operating voltage respectively when conducting a forming operation, a clear operation, a write operation and a read operation, and said forming voltage, said clear voltage and said write voltage are all greater than said operating voltage, and said forming voltage are greater than said clear voltage and further greater than said write voltage.

2. The non-volatile static random access memory of claim 1, wherein said first RRAM, said second RRAM, said third RRAM and said fourth RRAM are set respectively between said connected drains and a first metal layer, and said first RRAM overlaps said third drain, and said second RRAM overlaps said fifth drain, and said third RRAM overlaps said fourth drain, and said fourth RRAM overlaps said sixth drain.

3. The non-volatile static random access memory of claim 2, wherein each said RRAMs comprises a top electrode, a bottom electrode and a capacitive dielectric layer between said top electrode and said bottom electrode, and said top electrodes of said first RRAM and said second RRAM are connected to said first storage node through said first metal layer, and said top electrodes of said third RRAM and said fourth RRAM are connected to said second storage node through said first metal layer.

4. The non-volatile static random access memory of claim 3, wherein said top electrode is a titanium nitride/titanium composite layer, and said bottom electrode is a titanium nitride layer, and said capacitive dielectric layer is a hafnium oxide layer.

5. The non-volatile static random access memory of claim 1, wherein said third gate and said fifth gate are the same polysilicon pattern and are connected respectively to said fourth drain and said six drain through said third RRAM and said fourth RRAM, and said fourth gate and said sixth gate are the same polysilicon pattern and are connected respectively to said third drain and said fifth drain through said first RRAM and said second RRAM.

6. The non-volatile static random access memory of claim 1, wherein said first gate and said second gate are the same polysilicon pattern and are connected to said word line, and said word line is in a first metal layer.

7. The non-volatile static random access memory of claim 1, wherein active areas of said first pass gate transistor, said first pull-down transistor, said second pass gate transistor and said second pull-down transistor have first doping type, and active areas of said first pull-up transistor and said second pull-up transistor have second doping type.

8. The non-volatile static random access memory of claim 7, wherein said active areas are formed separately and are not electrically connected with each other.

9. The non-volatile static random access memory of claim 1, wherein said bit line and said complementary bit line are in a second metal layer.

10. The non-volatile static random access memory of claim 1, wherein said forming operation of said non-volatile static random access memory comprises:

applying said forming voltage from said bit line, applying a voltage of 0V from said complementary bit line and applying a voltage of 0V respectively from said first common power line and said second common power line, so that said first RRAM is converted from high level state to low level state;

applying a voltage of 0V from said bit line, applying said forming voltage from said complementary bit line and applying a voltage of 0V respectively from said first common power line and said second common power line, so that said third RRAM is converted from high level state to low level state; and applying said forming voltage respectively from said bit line, said complementary bit line and said first common power line, and applying a voltage of 0V from said second common power line, so that said second RRAM and said fourth RRAM are converted from high level state to low level state.

11. The non-volatile static random access memory of claim 1, wherein said clear operation of said non-volatile static random access memory comprises:

applying said clear voltage from said bit line, applying a voltage of 0V from said complementary bit line and applying a voltage of 0V respectively from said first common power line and said second common power line, so that said first RRAM is converted from high level state to low level state;

applying a voltage of 0V from said bit line, applying said clear voltage from said complementary bit line and applying a voltage of 0V respectively from said first common power line and said second common power line, so that said third RRAM is converted from high level state to low level state; and applying said clear voltage respectively from said bit line, said complementary bit line and said first common power line, and applying a voltage of 0V from said second common power line, so that said second RRAM and said fourth RRAM are converted from high level state to low level state.

12. The non-volatile static random access memory of claim 1, wherein said write operation of said non-volatile static random access memory comprises:

applying said write voltage from said bit line, applying a voltage of 0V from said complementary bit line, applying a voltage of 0V from said first common power line, and applying said write voltage from said second common power line, so that said first RRAM and said fourth RRAM are converted from low level state to high level state.

13. The non-volatile static random access memory of claim 1, wherein said write operation of said non-volatile static random access memory comprises:

applying a voltage of 0V from said bit line, applying said write voltage from said complementary bit line, applying a voltage of 0V from said first common power line, and applying said write voltage from said second common power line, so that said second RRAM and said third RRAM are converted from low level state to high level state.

14. The non-volatile static random access memory of claim 1, wherein said read operation of said non-volatile static random access memory comprises:
applying a pre-charge voltage respectively from said bit line and said complementary bit line, said operating voltage from said first common power line and applying a voltage of 0V from said second power line, wherein said pre-charge voltage is equal to an operation voltage.

* * * * *